United States Patent
Paruchuri

(10) Patent No.: US 7,152,315 B1
(45) Date of Patent: Dec. 26, 2006

(54) METHOD OF MAKING A PRINTED CIRCUIT BOARD

(75) Inventor: Mohan R. Paruchuri, Canton, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 331 days.

(21) Appl. No.: 10/826,019

(22) Filed: Apr. 17, 2004

Related U.S. Application Data

(63) Continuation of application No. 09/812,963, filed on Mar. 20, 2001.

(51) Int. Cl.
*H05K 3/20* (2006.01)
(52) U.S. Cl. .............................. 29/831; 29/830; 29/846
(58) Field of Classification Search .................. 29/825, 29/830, 831, 846, 852
See application file for complete search history.

(56) References Cited

U.S. PATENT DOCUMENTS

| | | | |
|---|---|---|---|
| 3,801,388 A | 4/1974 | Akiyama et al. | |
| 4,249,302 A | 2/1981 | Crepeau | |
| 4,404,059 A | 9/1983 | Livshits et al. | |
| 4,683,653 A | 8/1987 | Iwasa | |
| 5,224,265 A | 7/1993 | Dux et al. | |
| 5,227,338 A | 7/1993 | Kryzaniwsky | |
| 5,232,548 A | 8/1993 | Ehrenberg et al. | |
| 5,738,797 A | 4/1998 | Belke, Jr. et al. | |
| 5,758,413 A | 6/1998 | Chong et al. | |
| 5,768,108 A | 6/1998 | Miura et al. | |
| 5,786,986 A | 7/1998 | Bregman et al. | |
| 5,876,842 A | 3/1999 | Duffy et al. | |
| 6,098,282 A | 8/2000 | Frankeny et al. | |
| 6,248,959 B1 | 6/2001 | Sylvester | |
| 6,356,002 B1 | 3/2002 | Witherspoon et al. | |
| 6,449,839 B1* | 9/2002 | Glovatsky et al. | 29/847 |
| 6,492,201 B1 | 12/2002 | Haba | |
| 6,499,214 B1* | 12/2002 | Li et al. | 29/831 |
| 6,998,540 B1* | 2/2006 | Belke et al. | 174/263 |

\* cited by examiner

*Primary Examiner*—Carl J. Arbes
(74) *Attorney, Agent, or Firm*—Brinks Hofer Gilson & Lione

(57) ABSTRACT

A method 10, 80, 81 for making multi-layer electronic circuit boards 77, 137, 139 having metallized apertures 18, 20, 34, 40, 104, 106, 120.

6 Claims, 7 Drawing Sheets

METHOD OF MAKING A PRINTED CIRCUIT BOARD

RELATED APPLICATION

This application is a continuation of U.S. application Ser. No. 09/812,963 filed Mar. 20, 2001.

FIELD OF THE INVENTION

The present invention relates to a circuit board and a method for making an electrical circuit board and, more particularly, to a method for making a multi-layer electrical circuit board having multiple circuit interconnections and having apertures which are formed through the circuit board and/or through various portions of the circuit board.

BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires that one or more holes be drilled through each of the circuit boards, thereby creating at least one "through-hole" or "via" lying and/or traversing between some or all of the opposed components containing surfaces, and through some or all of the various component containing interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to minimize the need for such plating and drilling, such as by the use of a conductive epoxy within each of the drilled holes, these attempts have not produced reliable electrical interconnections and these produced interconnections are not typically adapted to allow for communication of electrical power signals by and between the board surfaces and/or by and between the board surfaces and the interior component containing portions.

There is therefore a need to provide a method for producing a multi-layer electrical circuit board which overcomes some or all of the previously delineated drawbacks and which selectively allows "vias" to be desirably and selectively formed and which further allows for the interconnection of one or more layers of electrical circuitry.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of apertures which allow for communication by and between some or all of the various component containing surfaces and portions of the formed multi-layer electrical circuit board, which selectively allow components contained within and/or upon these portions and surfaces to be interconnected, and which are further adapted to selectively and communicatively receive an electrical component and/or an electrical component connector portion.

According to a first aspect of the present invention a method for making an electric circuit board is provided. The method includes the steps of providing a core member having a first surface and a second surface; forming at least two apertures within the core member, each of the at least two apertures having a respective interior surface; attaching an adhesive material to the first and second surfaces and within the at least two apertures; forming apertures within a portion of the adhesive material; and applying a certain electrically conductive material to at least one of the interior surfaces, thereby forming a first pre-circuit assembly having at least one electroplated aperture.

According to a second aspect of the present invention a method for making a multi-layer electrical circuit board is provided. The method includes the steps of providing a core member having a first surface and a second surface; forming a first aperture, having a first interior surface, within the core member, and a second aperture, having a second interior surface, within the core member; selectively applying a certain dielectric material to the first surface and the second surface of the core member; selectively applying a certain electrically conductive material to selective portions of the first and the second surfaces which are respectively proximate to the first and the second apertures; applying the certain electrically conductive material upon the first and the second interior surfaces; thereby forming a first pre-circuit assembly having a first surface and a second surface; providing an adhesive material containing several selectively formed apertures; selectively applying the adhesive material to certain selective portions of the first and second surfaces of the first pre-circuit assembly, thereby forming a second pre-circuit assembly having a first surface and a second surface; attaching a first electrically conductive member to the first surface of the second pre-circuit assembly and attaching a second electrically conductive member to the second surface of the second pre-circuit assembly; removing certain portions of the first and second electrically conductive member effective to cooperatively form a third and fourth aperture, thereby forming a third pre-circuit assembly; selectively applying a certain adhesive material to the third pre-circuit assembly; providing a fourth pre-circuit assembly and a fifth pre-circuit assembly; and attaching the fourth and fifth pre-circuit assemblies to the third pre-circuit assembly, thereby forming a circuit assembly having a pair of electroplated apertures.

According to a third aspect of the invention a circuit board is provided. The circuit board comprises a core electrically conductive member contained between a first layer of epoxy and a second layer of epoxy; a first electrically conductive member contained between a first layer of adhesive material and a second layer of adhesive material, the second layer of adhesive material connected to the first layer of epoxy; a second electrically conductive member contained between a third layer of adhesive material and a fourth layer of adhesive material, the second layer of adhesive material connected to the second layer of epoxy; a first pre-circuit assembly having a first central member contained between a third electrically conductive member and fourth electrically conductive member, the fourth electrically conductive member being attached to the first layer of adhesive material; and a second pre-circuit assembly having a second central metal member contained between a fifth electrically conductive member and a sixth electrically conductive member, the fifth electrically conductive member being attached to the fourth layer of adhesive material, thereby forming a circuit board assembly, the second pre-circuit assembly cooperating with the fourth layer of the adhesive material and the second electrically conductive member to form at least one stepped aperture within the circuit board assembly.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
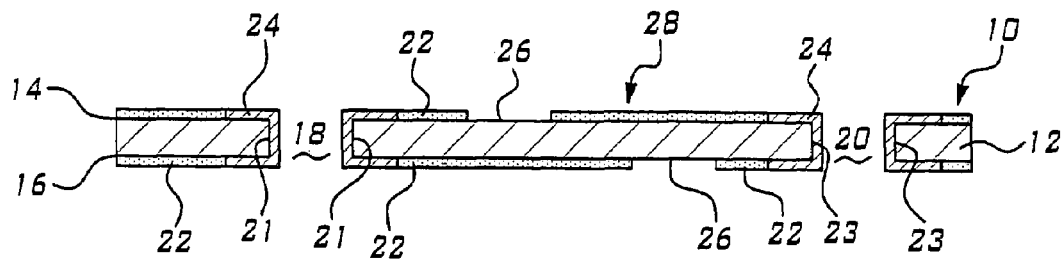
FIGS. 1(a)–(f) are successive sectional side views of a multi-layer circuit board being produced and/or formed in accordance with the teachings of the preferred embodiment of the invention.

Referring now to FIGS. 1(a)–(f), there is shown a method and/or a process 10 for selectively forming a multi-layer electrical circuit board in accordance with the teachings of the preferred embodiment of the invention. Specifically, as shown best in FIG. 1(a), the circuit board formation or creation process 10 begins with the acquisition and/or creation of a central or core member 12 having top surface 14 and bottom surface 16. In one non-limiting embodiment of the invention, core member 12 is electrically conductive and generally rectangular in shape. In this non-limiting embodiment, core member 12 comprises a copper strip or a metallic/electrically conductive foil. Further, core member 12 is etched, drilled, or punched in a known manner, Effective to produce and/or from apertures 18, 20 and to concomitantly expose interior surfaces 21, 23 of member 12 within respective apertures 18, 20. Further more a layer of a first dielectric material 22 is selectively applied upon certain portions of top surface 14, and the bottom surface 16, effective to allow certain respective portions 26 of surface 14, 16 to remain exposed and to further allow other portions of surfaces 14, 16 respectively proximate to apertures 18 or 20 to also remain exposed. A second dielectric material 24 is selectively placed upon those exposed portions of surfaces 14, 16 which are respectively proximate to apertures 18, 20 and upon surfaces 21, 23 which are respectively resident within apertures 18, 20, thereby forming pre-circuit assembly 28. In one non-limiting embodiment of the invention, material 24 is a conventional punching process or by other known and conventional methods and/or processes. It should be realized that apertures 104, 106, and 120 are respectively formed and/or drilled and extend through the material 92 residing within the previously formed apertures 88, 90, and 91.

Figure 2A:
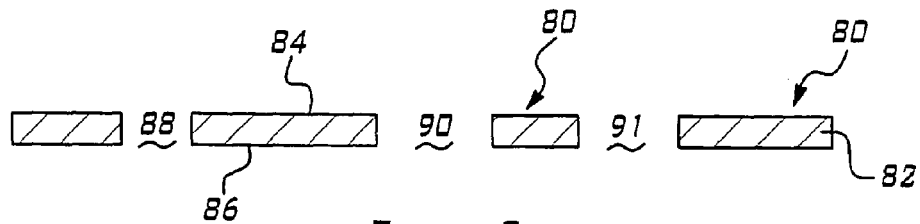
FIGS. 2(a)–(e) are successive sectional side views of a multi-layer circuit board being produced and/or formed in accordance with the teachings of a second embodiment of the invention.
Figure 2B:
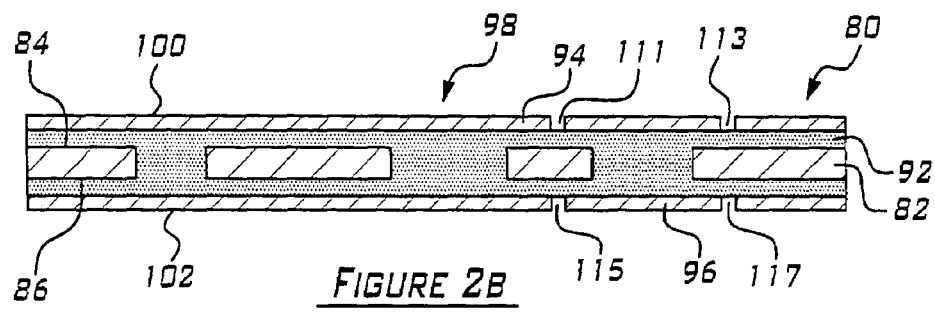
Figure 2C:
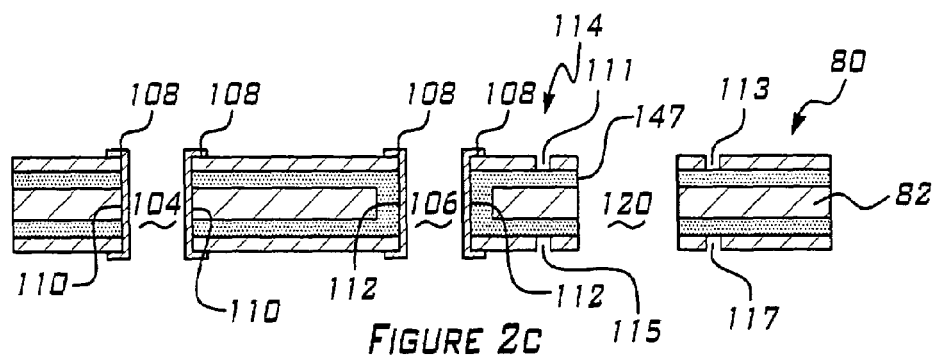

As further illustrated in FIG. 2(c), apertures 104, 106 are electroplated by a known and conventional electroplating process, effective to apply a layer of electrically conductive material 108 to cover those portions of core member 82, adhesive material 92, and members 94, 96 which respectively and cooperatively form the interior surfaces 110, 112 of apertures 104, 106, thereby forming pre-circuit assembly 114.

Figure 2D:
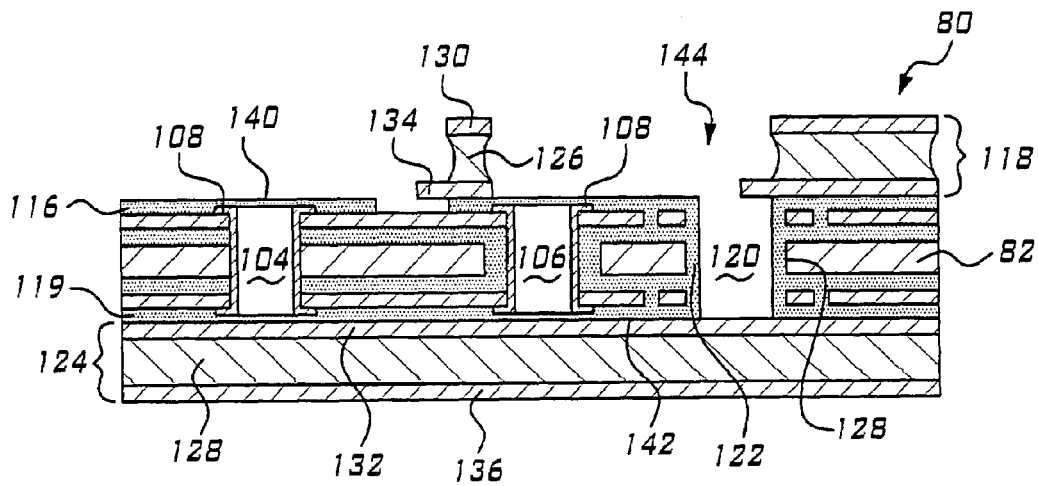
Figure 2E:
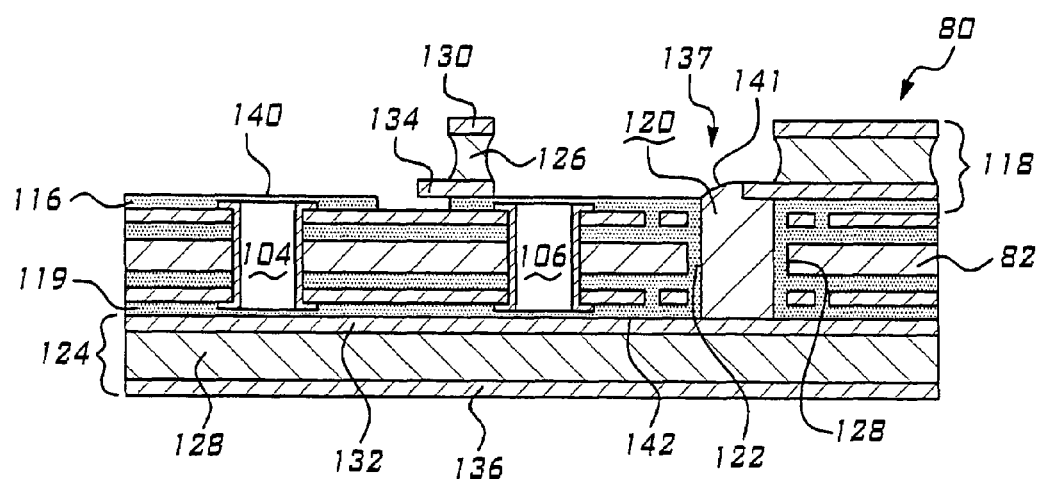

The process 80 continues, as best shown in FIG. 2(d), by providing a pair of adhesive layers 116, 119. Adhesive material 116 is selectively applied, connected, and/or coupled to the "top" surface of a pre-circuit assembly 114, and is effective to substantially "cover" the interior surface 147 of aperture 120 and to "fill" apertures 111, 113. Adhesive material 119 is selectively applied, connected, and/or coupled to the "bottom" surface of pre-circuit assembly 114, and is effective to substantially "fill" apertures 115, 117. In a further non-limiting embodiment of the invention, adhesive material layers 116, 119 are applied by a known and conventional and commercially available dielectric material.

Figure 1B:
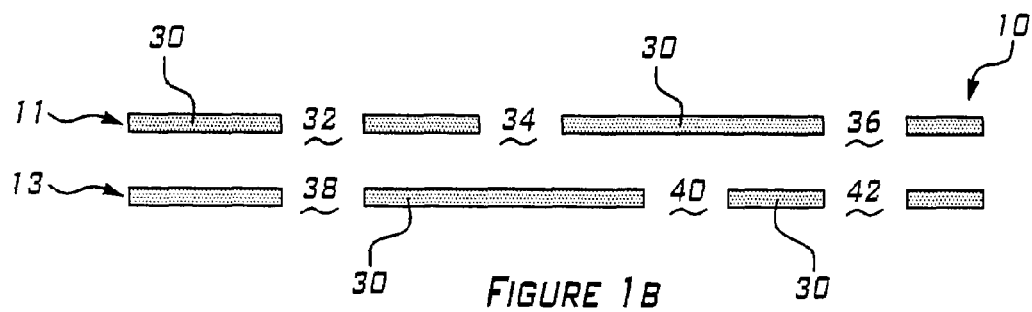

The second step of process 10, as shown best in FIG. 1(b), requires that a pair of layers 11, 13 of a certain commercially available dielectric adhesive material 30 are provided. Layers 11, 13 are each punched and/or drilled in a manner which is effective to produce apertures 32, 34, 36, within layer 11, and apertures 38, 40, and 42 within layer 13. While the preferred embodiment of the invention selectively utilizes dielectric material 22 upon member 12, in other non-limiting embodiments of the invention, the use of material 22 may be obviated by applying the adhesive material 30 directly upon those portions of the surfaces 14, 16 of member 12 which do not contain dielectric material 24.

Figure 1C:
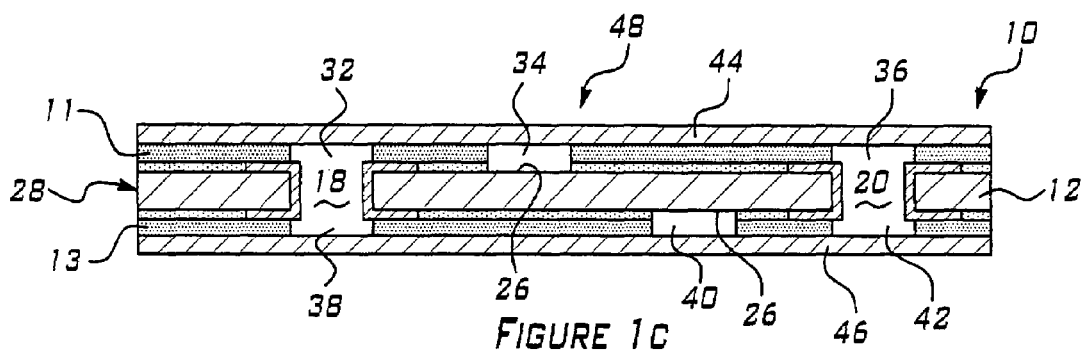

In the third step of process 10, as best shown in FIG. 1(c), the adhesive material layers 11, 13 are selectively attached, connected, or applied to pre-circuit assembly 28. Particularly, layer 11 is applied to materials 22 and 24 resident upon surface 14 while layer 13 is applied to material 22 and 24 resident upon surface 16. Apertures 32, 38 communicate with aperture 18 and apertures 36, 42 communicate with aperture 20 (e.g., the placement of layers 11, 13 upon pre-circuit assembly 28 allows apertures 18, 20 to selectively "grow" or extend through the layers 11, 13). Furthermore, apertures 34, 40 respectively terminate upon portions 26 of surface 14, 16, thereby allowing surface portions 26 to remain exposed after layers 11, 13 are placed on pre-circuit assembly 28 (i.e., no material is directly coupled to these portions 26).

As further illustrated in FIG. 1(c), a pair of electrically conductive members or layers 44, 46 are respectively attached, coupled, and/or connected to layers 11, 13, effective to cooperatively "cover" or overlay apertures 18, 20, thereby forming pre-circuit assembly 48. In one non-limiting embodiment of the invention, layers or members 44, 46 each comprise a conventional and commercially available copper material. In a further non-limiting embodiment of the invention, electrically conductive members 44, 46 are respectively attached to the adhesive material 30 by a known and conventional laminating process.

Figure 1D:
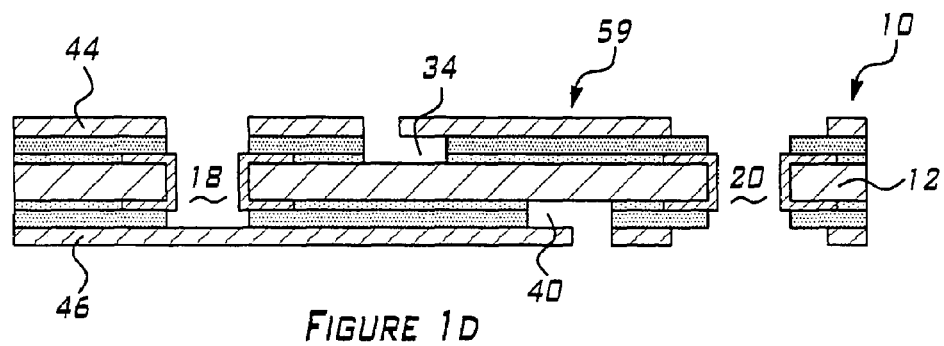

In the fourth step of process 10, as shown best in FIG. 1(d), members 44, 46 are subjected to a conventional image printing process, whereby only certain selective portions of members 44, 46 are allowed to remain exposed. Further, process 10 continues by selectively applying a certain etchant material (i.e., a copper etchant) to those exposed portions of members 44, 46 (i.e., the portions of member 44 respectively residing above apertures 18 and 20 remain exposed as does the portion of the member 46 respectively overlaying or residing above aperture 20). The selective application of this etchant material allows the respectively exposed portions of member 44, 46 to be selectively removed or "etched away", thereby allowing apertures 18, 20 to be selectively expanded, lengthened, or grown. Particularly, by etching member 44, 46, aperture 18 is made to extend through member 44 while terminating upon member 46. Concomitantly, aperture 20 is expanded, lengthened, or grown through the entire formed pre-circuit assembly 59. Furthermore, the selective etching of members 44, 46 causes apertures 34, 40 to be selectively and respectively extended through members 44, 46 of the formed pre-circuit assembly 59.

Figure 1E:
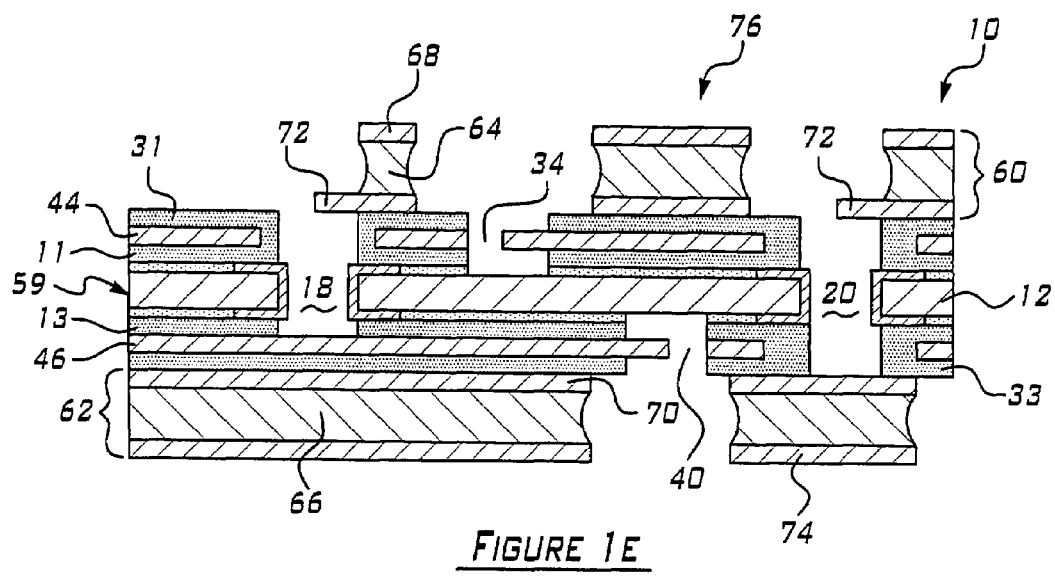

The fifth step of process 10, as shown best in FIG. 1(e), requires the use of two pre-circuit assemblies 60, 62. Each pre-circuit assembly 60, 62 respectively contains a core portion 64, 66. In one non-limiting embodiment of the invention, core portions 64, 66 each comprise a conventional and commercially available aluminum material. Pre-circuit assemblies 60, 62 further respectively contain several electrically conductive portions 68, 70 which are respectively attached to the "top" of core portions 64, 66 and several electrically conductive portions 72, 74 which are respectively attached to the "bottom" of core portions 64, 66.

Pre-circuit assemblies 60, 62 are selectively attached to pre-circuit assembly 59 by use of a pair of dielectric adhesive layers 31, 33. As shown, layer 31 engages member 44 and cooperates with layer 11 to cover the portion of the member 44 resident within the aperture 18 and to cover the portion of the member 44 resident within the aperture 20. In a similar manner, layer 33 engages member 46 and cooperates with the layer 13 to cover the portion of the member 46 resident within the aperture 20.

As further illustrated in FIG. 1(e), a certain etchant material (i.e., an aluminum etchant) is selectively applied to certain portions of core members 64, 66 which remained exposed (i.e., those portions of core members 64, 66 which were not respectively covered by electrically conductive portions 68, 74), effective to selectively remove or "etch away" certain selective portions of core members 64, 66, thereby forming a circuit board assembly 76.

The selective etching of core members 64, 66 allows the formed apertures 18, 20, 34, 40 to be selectively lengthened or grown. Further, portions 72 extend over and within respective apertures 18, 20, member 46 extends within aperture 40, and member 44 extends within aperture 34. It should be appreciated that the formed apertures 18, 20, 34, and 40 are each "blind" type apertures (e.g., only one end of the formed aperture is exposed or "open"). Further, each aperture 18, 20, 34, and 40 selectively forms a connection "port" or "via" through or in which various circuit board portions, devices, connectors and/or connector assemblies may be placed and secured in a desired fashion, such as by a conventional soldering process, which is more fully delineated below. These apertures 18, 20, 34 and 40 electrically interconnect to certain circuit pathways which may be selectively formed throughout circuit board assembly 76 and which cooperatively allow for a variety of desired circuit board and/or electrical component connection strategies to be achieved. It should be appreciated that portions 72, which extend over apertures 18 and 20, engage electrically conductive material which is placed within these respective apertures 18, 20 and provide or increase the surface area which contacts the material, thereby allowing the material to be securely fixed within these respective apertures 18, 20, while the extended portions of members 44, 46 provide similar function within respective apertures 34, 40.

Figure 1F:
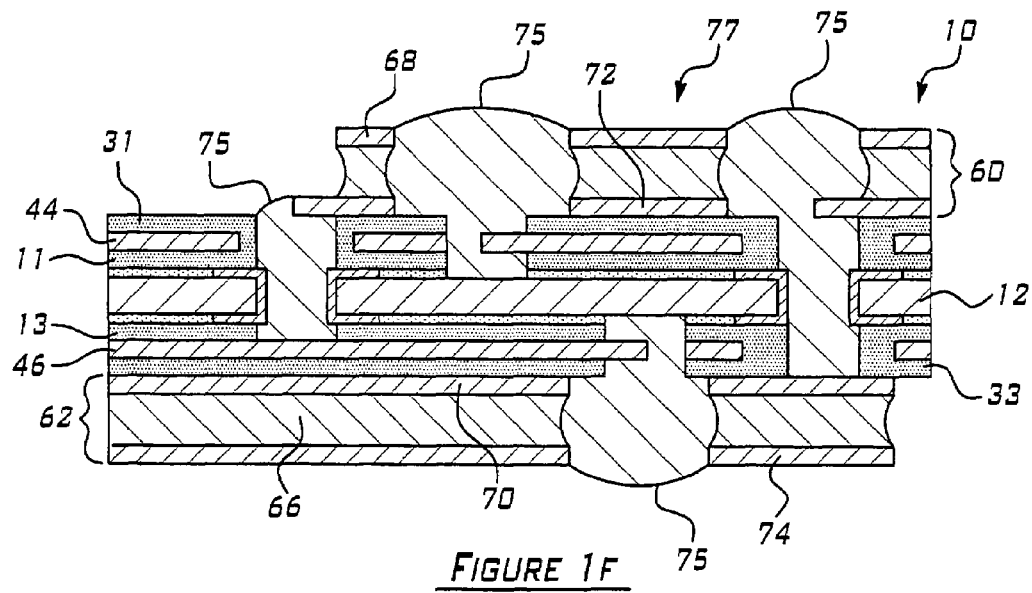

In the sixth step of process 10, as shown best in FIG. 1(f), a certain electrically conductive material 75 is selectively and insertably placed within each of the apertures 18, 20, 34 and 40, thereby "filling" apertures 18, 20, 34 and 40, and forming pre-circuit assembly 77. In one non-limiting embodiment of the invention, material 75 comprises a conventional and commercially available solder material and is applied to and/or within apertures 18, 20, 34, and 40 in a known and conventional manner. In this manner, material 75 allows conductive members or layer 68, 70 and 72 to be physically and electrically interconnected.

Referring now to FIGS. 2(a)–2(f), there is shown a process or method 80 for forming a multi-layer circuit assembly in accordance with the teachings of a second embodiment of the present invention. Process 80 begins, as shown best in FIG. 2(a), by providing an electrically conductive member 82 having first or top surface 84 and second or bottom surface 86. In one non-limiting embodiment of the invention, member 82 comprises a conventional and commercially available copper material.

As further illustrated in FIG. 2(a), apertures 88, 90, and 91 are formed by drilling member 82 in a conventional manner. However, in other non-limiting embodiments of the invention, apertures 88, 90, and 91 may be formed by other known and conventional methods, such as punching or selective etching. In the preferred embodiment of the invention, apertures 88, 90, and 91 are of different sizes. However, in other non-limiting embodiments of the invention, apertures 88, 90, 91 may each be of a substantially similar size and shape and may each be of a size and shape which is dissimilar from that which is shown in FIG. 2(a).

In the second step of process 80, which is shown best in FIG. 2(b), a conventional and commercially available adhesive material 92 is provided. Material 92 is selectively applied to both the top surface 84 of member 82 and the bottom surface 86 of member 82 and concomitantly fills or resides within apertures 88, 90, and 91. In one non-limiting embodiment, adhesive material 92 is applied to member 12 by a known conventional laminating process. In a further non-limiting embodiment, adhesive material 92 comprises a conventional and commercially available dielectric material.

Process 10 continues, as shown best in FIG. 2(*b*), by acquiring and/or forming electrically conductive members 94 and 96 which are each respectively attached, coupled or connected to opposite surfaces of the adhesive material 92. In this manner, member 94 "overlays" member 82 and member 82 "overlays" member 96, thereby forming pre-circuit assembly 98 which has a first or top surface 100 and a second or bottom surface 102.

Electrically conductive members 94, 96 each respectively include a pair of apertures, 111, 113; and 155, 117. In one non-limiting embodiment, apertures 111, 113, 115, and 117 are formed by a conventional drilling, etching, or punching process. In a further non-limiting embodiment of the invention, apertures 11, 113, 115, and 117 are respectively formed within members 94, 96 before members 94, 96 are attached to material 92. In a further non-limiting embodiment of the invention, electrically conductive members 94, 96 each comprise a conventional and commercially available copper material. In other non-limiting embodiments of the invention, electrically conductive members 94, 96 are attached to adhesive material 92 by a conventional laminating process. Furthermore, it should be understood that adhesive material 92 and members 94, 96 may, in a further non-limiting embodiment, be applied, connected and/or coupled to member 82 in a conventional "one-step" process.

In the third step of process 80, which is best shown in FIG. 2(*c*), apertures 104, 106, and 120 are formed within pre-circuit assembly 98. In one non-limiting embodiment of the invention, apertures 104, 106, and 120 are each formed by a known and conventional drilling process. However, in other non-limiting embodiments, apertures 104, 106, and 120 are each formed by a conventional laminating process. As shown, adhesive layers 116, 119 are applied to pre-circuit assembly 114 in such a manner as to cooperatively overlay both open ends of each of the apertures 104, 106 (i.e., to cooperatively "close" apertures 104, 106).

Process 80 continues, as further shown in FIG. 2(*d*), by providing a pair of pre-circuit assemblies 118, 124. Pre-circuit assembly 118 includes a core member 126 which is contained between an electrically conductive member 130 and an electrically conductive member 134. Pre-circuit assembly 124 includes a core member 128 which is contained between an electrically conductive member 132, and an electrically conductive member 136. In one non-limiting embodiment of the invention, core members 126 and 128 each comprise a conventional and commercially available aluminum material. In a further non-limiting embodiment of the invention, electrically conductive portions or members 130, 132, 134, 136 each comprise a conventional and commercially available copper material.

Pre-circuit assemblies 118, 124 are each respectively attached, connected, or coupled to adhesive layer 116, 119, thereby forming pre-circuit assembly 144. Particularly, pre-circuit assembly 118 is attached, connected, or coupled to the "top" surface 140 of adhesive material 116 by connecting the electrically conductive member 134 to the adhesive material 116. Pre-circuit assembly 124 is selectively attached, connected, or coupled to the "bottom" surface 142 of adhesive material 119 by connecting the electrically conductive member 132 to the surface 142. In one non-limiting embodiment of the invention, pre-circuit assemblies 118, 124 are each respectively attached, connected, or coupled to adhesive material layers 116, 119 by a known and conventional laminating process. It should be realized that adhesive material layers 116, 119 and pre-circuit assemblies 118, 124 may be applied or connected to pre-circuit assembly 114 in a conventional "one-step" process, thus obviating the need to separately attach each layer of adhesive material 116, 119 and/or each assembly 118, 124.

A certain etchant material (e.g., an aluminum etchant) is selectively applied to certain exposed portions of pre-circuit assembly 118. That is an etchant is applied to certain exposed portions of core member 126 (e.g., those portions of core metal member 126 which are not "covered" by the electrically conductive member 130). The application of an etchant to core member 126 removes or "etches away" those exposed portions of core member 126 and a portion of member 134 extends over aperture 120. The extended portion of member 134 allows electrically conductive material which may be selectively placed within aperture 120 to engage the extended portion of member 134 and to increases the surface area upon which the deposited electrically conductive material may adhere to, thereby securely fixing the deposited material within the aperture 120.

It should be appreciated that the formed pre-circuit assembly 144 contains apertures 104, 106 which are electroplated and/or "coated" with electrically conductive material 108, and aperture 120, which is not electroplated, but which contains or is "coated" with adhesive materials 116, 119. Aperture 120 terminates upon member 132. It should further be appreciated that the formed pre-circuit assembly 144 may be processed in other known and conventional manners effective to achieve multiple desired circuit board and/or component interconnection strategies.

As shown in 2(*e*), the pre-circuit assembly 144 may be further processed in a manner which allows for a certain electrically conductive material 141 to be placed or inserted within aperture 120, thereby forming pre-circuit assembly 137. In one non-limiting embodiment, electrically conductive material 141 comprises a conventional and commercially available solder material which is placed within aperture 120 in a known an conventional manner. Material 141 allows member 134 to be electrically connected to member 132.

Figure 9:
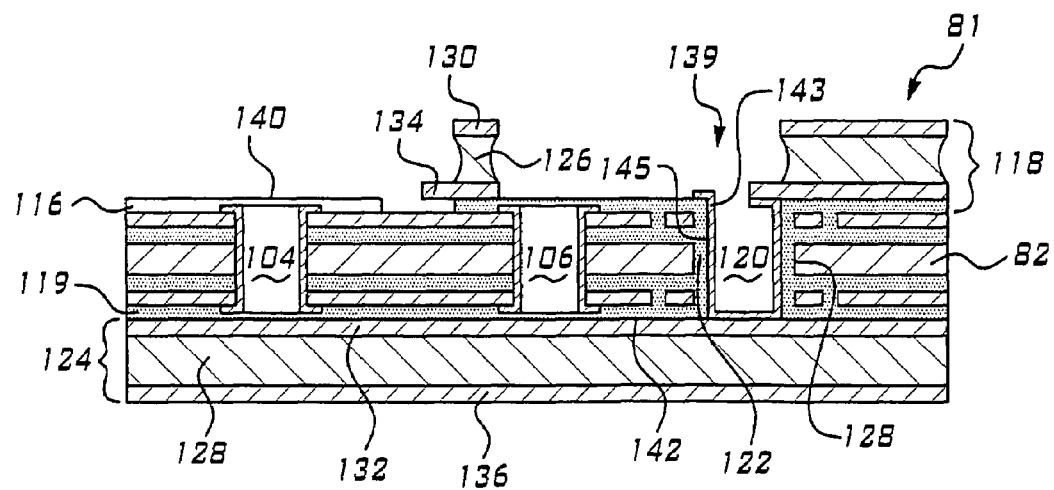
FIG. 9 is a sectional side view of the circuit assembly which is formed in accordance with the teachings of a ninth embodiment of the invention.

As shown in FIG. 9, in one non-limiting embodiment, the pre-circuit assembly 144, which is shown in FIG. 2(*d*), may be alternately processed according to process 81 in which a certain electrically conductive material 143 is selectively placed within aperture 120, effective to "cover" or "coat" the interior surface 145, thereby forming pre-circuit assembly 139. In a further non-limiting embodiment of the invention, electrically conductive material 143 comprises a conventional and commercially available copper material which is applied within aperture 120 upon surface 145 by a known and conventional electroplating process, thereby forming a connection "port" or "via" within the formed circuit board 139 which is adapted to selectively receive a component, element, or device. In a further non-limiting embodiment of the invention, electrically conductive material 143 is substantially similar or identical to electrically conductive material 108.

Figure 3:
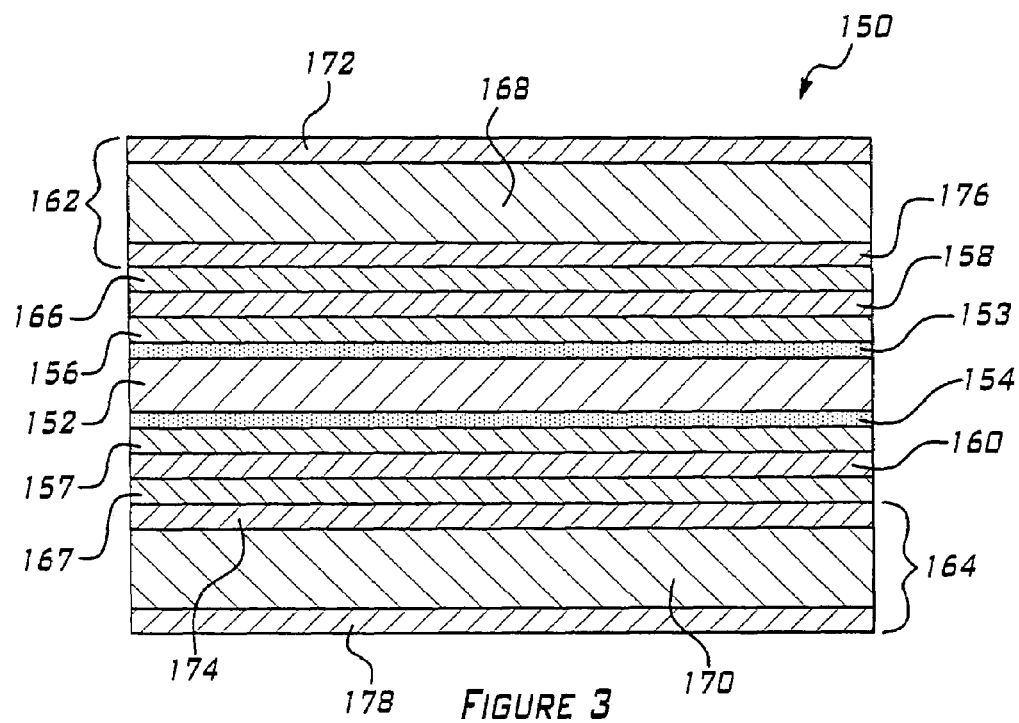
FIG. 3 is a sectional side view of a multi-layer circuit board assembly which is produced and/or formed in accordance with the teachings of a third embodiment of the invention.

Referring now to FIG. 3, there is shown a pre-circuit assembly 150 which is made in accordance with the teachings of a third embodiment of the invention. Pre-circuit assembly 150 is formed by "building up" or sequentially adding various layers of certain materials to a core member 152. Particularly, epoxy layers 153, 154 are respectively applied to and respectively "cover" the "top" and "bottom" surfaces of the electrically conductive member 152. Adhesive material layers 156, 157 are respectively applied, connected, coupled, and attached to epoxy layers 153, 154. Electrically conductive member 158, 160 are respectively connected, coupled, and attached to adhesive material layers 156, 157. In one non-limiting embodiment of the invention, electrically conductive member 158, 160 each comprise a conventional and commercially available copper material. In a further non-limiting embodiment of the invention, electrically conductive members 158, 160 are respectively connected, coupled, or attached to adhesive material layers 156, 157 by a known and conventional laminating process. In a further non-limiting embodiment of the invention, electrically conductive members 158, 160 are respectively applied to the layers of adhesive material 156, 157 as layers 156, 157 are respectively applied, connected, coupled, or attached to the layers of epoxy material 153, 154 in a conventional "one-step" laminating process.

Pre-circuit assemblies 162, 164 are each respectively attached, coupled, or connected to electrically conductive members 158, 160 by a respective layer of a conventional and commercially available adhesive material 166, 167. In one non-limiting embodiment of the invention, pre-circuit assemblies 162, 164 are respectively attached, coupled, or connected to adhesive material 166, 167 by a known and conventional laminating process. In a further embodiment of the invention, the adhesive material layers 166, 167 are each respectively attached, coupled, and connected to electrically conductive members 158, 160 in a conventional "one-step" laminating process.

Pre-circuit assemblies 162, 164 each respectively include core member 168, 170. Core members 168, 170 have or are coupled to a respective first or "top" electrically conductive member 172, 174, and a respective second or "bottom" electrically conductive member 176, 178. Further, pre-circuit assembly 162 is attached to adhesive material 166 by connecting, coupling, and/or attaching member 176 to adhesive material 166 and pre-circuit assembly 164 is attached to material 167 by connecting, coupling, and/or attaching member 174 to adhesive material 167.

It should be understood that pre-circuit assembly 150, as illustrated above, may be concomitantly processed in various desired manners, as will be more fully delineated below and as will be more fully illustrated in FIGS. 4–8, effective to allow multiple circuit interconnection strategies to be employed over various portions or regions of a formed electric circuit board assembly, while further allowing multiple component connection strategies to be concomitantly employed. Pre-circuit assembly 150 may also operatively be populated by components and utilized as a circuit board or assembly.

Figure 4:
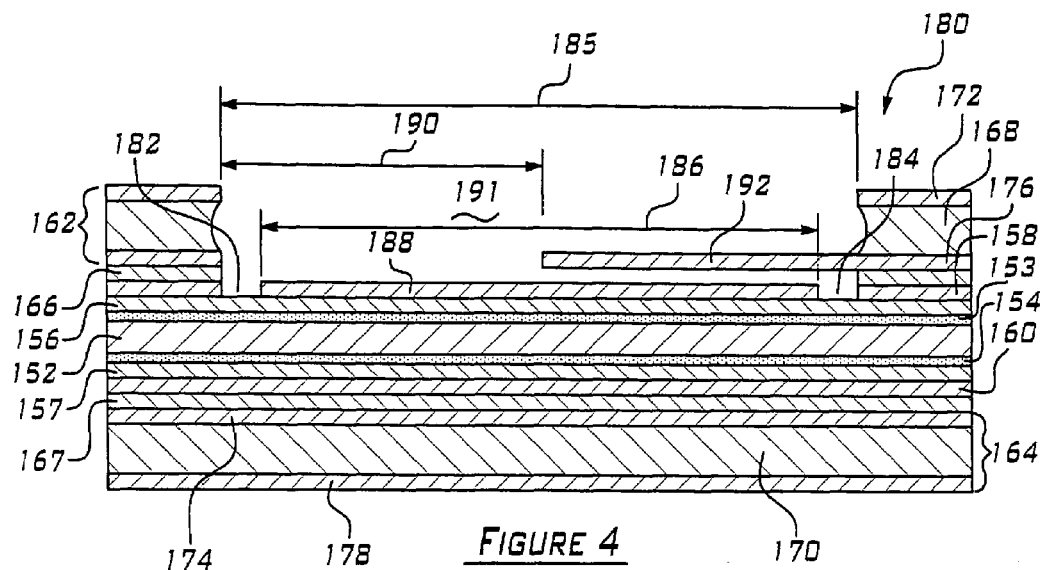
FIG. 4 is a sectional side view of the circuit assembly which is formed in accordance with the teachings of a fourth embodiment of the invention.

Referring now to FIG. 4, there is shown a pre-circuit assembly 180. Particularly, during the circuit board formation process which yields the formed circuit board assembly 180, certain portions of electrically conductive member 158 are selectively removed, such as by drilling, etching, or punching, thereby creating notches or recesses 182, 184 within electrically conductive member 158 and further allowing portion or "pad" 188 of electrically conductive member 158 to remain within region 186. The portion of adhesive material 166 which connects electrically conductive member 158 to pre-circuit assembly 162 is removed within region 185. A portion of the electrically conductive member 176 is removed from within region 190, while the remaining portion 192 of the member 176 (e.g., that portion of member 176 not removed) remains "suspended" within region 185 and cooperates with the remaining portion 188 to form a "step". As further shown in FIG. 4, a portion of core member 168 and electrically conductive member 172 are removed, such as by etching, drilling, or punching, within region 185.

It should be appreciated that the formed pre-circuit assembly 180 includes a "stepped" aperture 191 and may be further processed in a manner which allows for the selective formation of desired and relatively secure connections, facilitating the use of a diverse number and type of interconnection and/or component connection strategies. In one non-limiting embodiment of the invention an electrically conductive material, such as a conventional solder material, may be placed within the "stepped" aperture 191 and electrically connects the various electrically conductive layers 158, 172, and 176. The applied solder material flows between and occupies the space between the suspended portion 192 of member 176 and the member 188 and within the recesses 182, 184. These recesses 182, 184 and portion 192 and member 188 thereby cooperate to engage the material within the aperture 191 and increase the amount of surface area, within aperture 191, to which the material may adhere. In a further non-limiting embodiment of the invention, certain portions of the pre-circuit assembly 180 may be selectively electroplated in a known and conventional manner, thereby forming a desired circuit interconnection.

Figure 5:
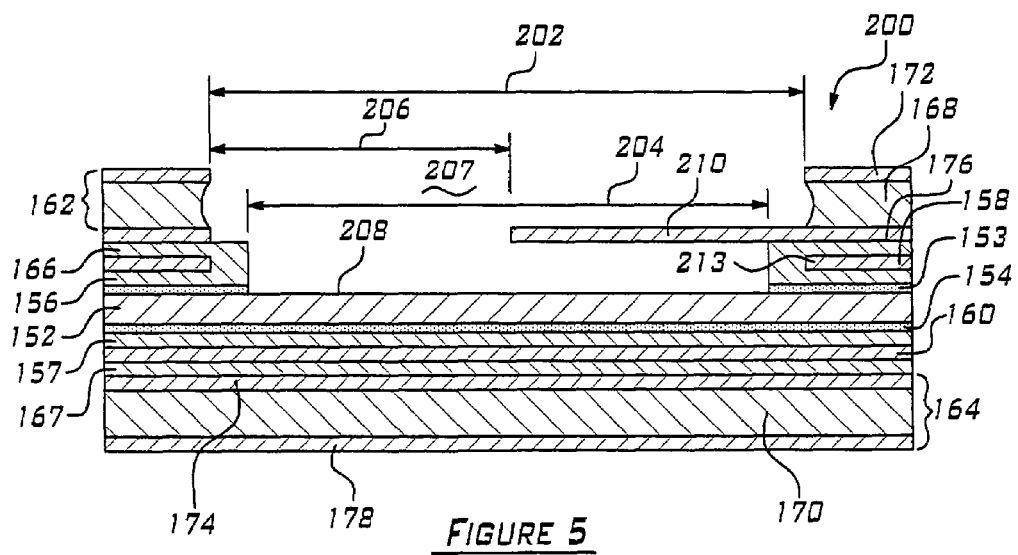
FIG. 5 is a sectional side view of the circuit assembly which is formed in accordance with the teachings of a fifth embodiment of the invention.

Referring now to FIG. 5, there is shown a pre-circuit assembly 180. Particularly, during the circuit board formation process which yields the formed circuit board assembly 200, a certain portion of electrically conductive member 158 is removed from within region 202 by a conventional etching, drilling or punching process. Adhesive material 166 and 156 are caused to engage member 158 and a portion of layers 166, 156 are removed from within region 204 and made to cooperatively enclose the exposed ends 213 of the remaining portions of member 158. In one non-limiting embodiment, during the respective application or connection of adhesive layers 166 and 156 a conventional laminating process allows the materials to movably engage member 158 and isolate member 158 from aperture 207. A certain portion of the epoxy material 153 which resides within region 204 is removed, thereby exposing a surface area or portion 208 of the electrically conductive core member 152 within the region or area 204. A portion of the electrically conductive member 176 is removed from within the region or area 206, while that portion 210 of the remaining member 176 (e.g., that portion of member 176 which is not removed) is horizontally "suspended" within region or area 204 above core member 152 and cooperates with core member 152 to form a "step". A portion of the member 168 and the electrically conductive member 172 are removed or otherwise "etched away" by a known and conventional etching process from within region 202.

It should be appreciated that the formed pre-circuit assembly 200 includes a "stepped" aperture 207 and may be further processed in a manner which allows for the selective formation of desired circuit interconnection strategies and/or component connection strategies. For example and without limitation, in one non-limiting embodiment of the invention, an electrically conductive material such as a conventional solder material may be selectively placed within the "stepped" aperture 207. Particularly, the deposited material flows between and substantially fills the relatively larger space (i.e., extending through several layers of material) between the extended portion 210 of member 176 and member 152, thereby engaging and electrically connecting the portion 210 and the member 152. Hence, portion 210 and member 152 cooperatively increase the amount of surface area, within aperture 207, to which the deposited material may bond. Assembly 200 may be electroplated in a known and conventional manner, thereby forming a desired circuit interconnection.

Figure 6:
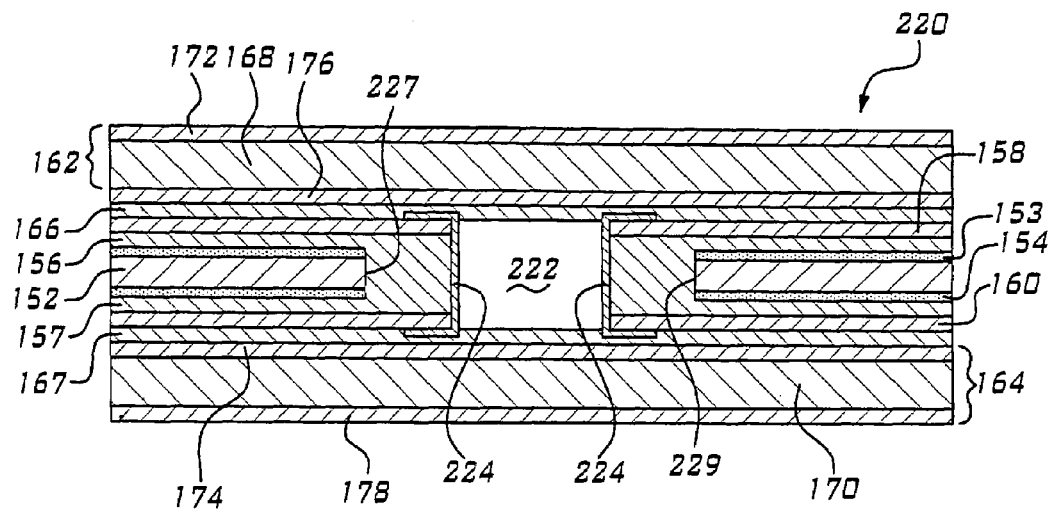
FIG. 6 is a sectional side view of the circuit assembly which is formed in accordance with the teachings of a sixth embodiment of the invention.

Referring now to FIG. 6, there is shown a pre-circuit assembly 220. In the circuit board formation process which yields circuit board assembly 220, a portion of the electrically conductive core member 152, the epoxy layers 153, 154, and the members 158, 160 are selectively removed by a conventional process, such as drilling, punching, or etching. Furthermore, certain portions of the adhesive material layers 156, 157 are removed, thereby forming an aperture 222. The remaining adhesive layer portions are disposed upon the interior surfaces 227, 229 of members 152 and epoxy material 153, 154, effective to electrically isolate member 152 from aperture 222.

Prior to the attachment of adhesive layers 166, 167 and pre-circuit assemblies 162, 164, a certain electrically conductive material 224 is attached and/or applied to the interior surface of the formed aperture 222 which is cooperatively formed by adhesive layers 156, 157 and members 158, 160, and to certain portions of members 158, 160 proximate to the formed aperture 222. In this manner, aperture 222 is selectively electroplated while allowing electrically conductive members 158, 160 to be electrically connected to the electroplated aperture 222. In one non-limiting embodiment of the invention, electrically conductive material 224 is a conventional and commercially available copper material and is applied by a known and conventional electroplating process.

It should be appreciated that the formed pre-circuit assembly 220 includes an electroplated aperture 222 and may be further processed in a manner which allows for the selective formation of desired circuit connection strategies and/or components connection strategies. Furthermore, in one non-limiting embodiment of the invention, an electrically conductive material, such as a conventional and commercially available solder material, may be insertably placed within aperture 222, thereby forming a desired circuit interconnection and electrically connecting layers 158 and 160.

Figure 7:
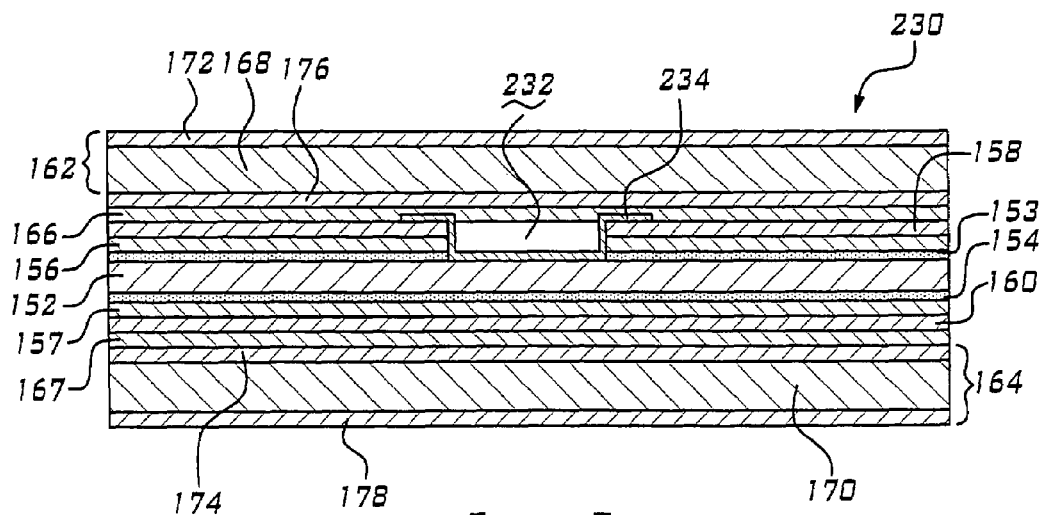
FIG. 7 is a sectional side view of the circuit assembly which is formed in accordance with the teachings of a seventh embodiment of the invention.

Referring now to FIG. 7, there is shown a pre-circuit assembly 230. In the circuit board formation process which yields the formed circuit board assembly 230, a portion of electrically conductive member 158, adhesive material 156, and epoxy material 153 are each removed in a known conventional manner, such as by etching, punching, and/or drilling, effective to form aperture 232, prior to the application of pre-circuit assembly 162 and adhesive layer 166.

A layer of electrically conductive material 234 is selectively applied within the formed aperture 232. Particularly, electrically conductive material 234 "coats" or "covers" those portions of core member 152, epoxy material 153, adhesive material 156, and certain portions of electrically conductive member 158 which are located within and/or which reside within aperture 232 and a portion of the electrically conductive member 158 which is proximate to the formed aperture 232. In one non-limiting embodiment of the invention, material 234 is applied by a known and conventional electroplating process.

It should be appreciated that formed pre-circuit assembly 230 includes an electroplated aperture 232 and may be further processed in a manner which allows for the selective formation of desired circuit board connection strategies and/or component connection strategies. Furthermore, in one non-limiting embodiment of the invention, an electrically conductive material, such as a conventional and commercially available solder material, may be insertably placed within aperture 232, thereby forming a desired circuit interconnection and electrically connecting layer or member 158 with layer or member 152.

Figure 8:
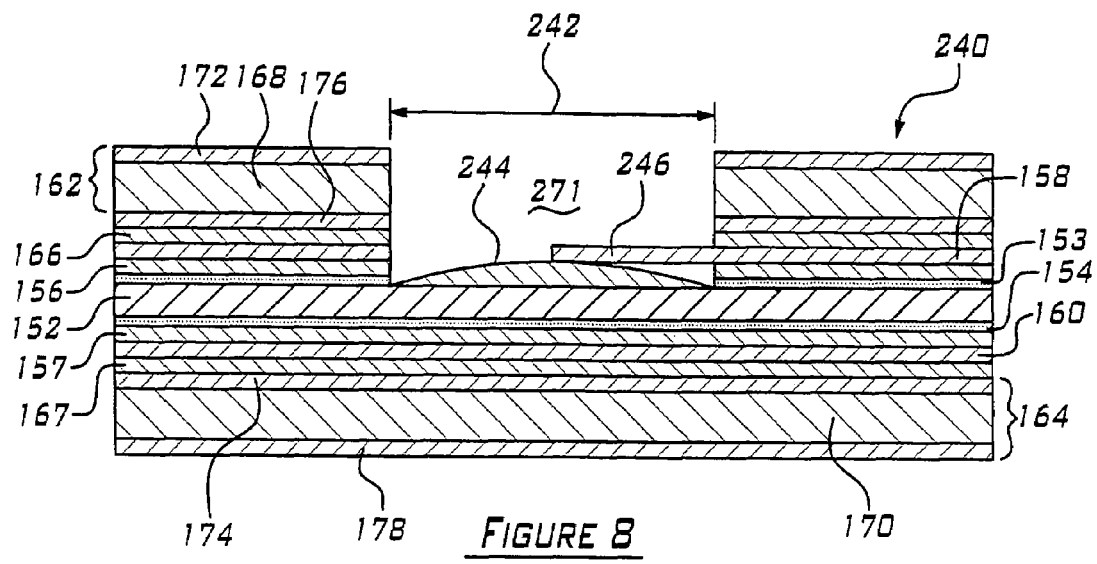
FIG. 8 is a sectional side view of the circuit assembly which is formed in accordance with the teachings of an eighth embodiment of the invention.

Referring now to FIG. 8, there is shown a pre-circuit assembly 240. Particularly, a certain portion of epoxy material 153, adhesive materials 157, 166, electrically conductive members 172, 176, and core member 168 each are selectively removed from within the region or area 242 by a conventional process, such as by drilling, punching, and/or selective etching, thereby forming aperture 271. Further, only a certain portion of electrically conductive member 158 is removed from the region or area 242, effective to allow a certain portion 246 of electrically conductive member 158 to remain extended or "suspended" within area or region 242 and cooperating with core member 152 to form a "step".

A certain electrically conductive material 244 is selectively applied to the portion of core member 152 which is exposed within region or area 242 and is made to reside within the space between member 152 and the extended portion 246 of member 158, thereby forming a "mound". The portion 246 and member 152 increase the amount of surface area with which the material 244 may bond, effective to allow the material 244 to be securely fixed within the aperture 271 and to electrically connect layer or member 158 with layer or member 152.

It should further be realized that the formed pre-circuit assemblies 180, 200, 220, 230, and 240 may be selectively and concomitantly formed on multiple portions of the same circuit board assembly 150.

It should be understood that the invention is not limited to the exact embodiment or construction which as been illustrated and described but that various changes may be made without departing from the spirit and the scope of the invention.

What is claimed is:

1. A method for making a circuit board, said method comprising the steps of:
    providing an electrically conductive core member having at least one aperture traversing from a top surface to a bottom surface of said electrically conductive core member;
    applying a layer of a first dielectric material to said top surface and said bottom surface while leaving said at least one aperture exposed;
    applying a separate second dielectric material upon said exposed at least one aperture, thereby forming a first pre-circuit assembly having a core member with said first dielectric material upon said top surface and said bottom surface and said second dielectric material within said at least one aperture;
    applying a pair of layers of adhesive to said first pre-circuit assembly, wherein said layers of adhesive material have at least one aperture which corresponds to said at least one aperture in said core assembly;
    providing a pair of electrically conductive members;
    coupling said pair of conductive members to said first pre-circuit assembly to substantially cover said at least one aperture; and
    removing at least one portion of said pair of conductive members which covers said at least one aperture.

2. The method of claim 1 further comprising the steps of:
    providing at least one second pre-circuit assembly; and
    coupling said at least one second pre-circuit assembly to at least one of said pair of conductive members.

3. The method of claim 2 further comprising the step of inserting solder material within said at least one aperture to electrically couple said-first pre-circuit assembly to said at least one second pre-circuit assembly.

4. The method of claim 1 wherein said pair of conductive members are coupled to said first pre-circuit assembly through said pair of layers of adhesive material.

5. The method of claim 4 wherein said pair of conductive members are coupled to pair of layers of adhesive material by a laminating process.

6. The method of claim 1 wherein the step of removing at least one portion of said pair of conductive members comprises the steps of:
    subjecting said pair of conductive members to an image printing process, whereby said at least one portion remains exposed; and
    applying an etching material to said exposed at least one portion of said pair of conductive members.

* * * * *